United States Patent
Ausschnitt et al.

(10) Patent No.: US 10,481,504 B2
(45) Date of Patent: Nov. 19, 2019

(54) METHOD AND APPARATUS FOR SEMICONDUCTOR MANUFACTURING

(71) Applicant: IMEC VZW, Leuven (BE)

(72) Inventors: Christopher Ausschnitt, Heverlee (BE); Vincent Truffert, Woluwe Saint-Pierre (BE)

(73) Assignee: IMEC VZW, Leuven (BE)

(*) Notice: Subject to any disclaimer, the term of this patent is extended or adjusted under 35 U.S.C. 154(b) by 0 days.

(21) Appl. No.: 16/308,363

(22) PCT Filed: Jun. 9, 2017

(86) PCT No.: PCT/EP2017/064145
§ 371 (c)(1),
(2) Date: Dec. 7, 2018

(87) PCT Pub. No.: WO2017/212035
PCT Pub. Date: Dec. 14, 2017

(65) Prior Publication Data
US 2019/0137881 A1    May 9, 2019

(30) Foreign Application Priority Data

Jun. 10, 2016  (EP) .................................. 16174048
Mar. 31, 2017  (EP) .................................. 17164311

(51) Int. Cl.
*G06F 17/50*    (2006.01)
*G03F 7/20*    (2006.01)

(52) U.S. Cl.
CPC .......... *G03F 7/705* (2013.01); *G03F 7/70616* (2013.01); *G03F 7/70625* (2013.01); *G03F 7/70633* (2013.01)

(58) Field of Classification Search
USPC ............................. 716/50, 51, 52, 53, 54, 55
See application file for complete search history.

(56) References Cited

U.S. PATENT DOCUMENTS 6,027,842 A    2/2000  Ausschnitt
6,571,383 B1*  5/2003  Butt .......................... G03F 1/36
                                                           382/149

(Continued)

FOREIGN PATENT DOCUMENTS

WO    2012/118667 A1    9/2012

OTHER PUBLICATIONS

PCT International Search Report and Written Opinion, PCT International Application No. PCT/EP2017/064145, dated Sep. 19, 2017, 14 pages.

*Primary Examiner* — Brian Ngo
(74) *Attorney, Agent, or Firm* — McDonnell Boehnen Hulbert & Berghoff LLP

(57) ABSTRACT

Examples herein are related to a method and apparatus for determining dimensions of features in a patterned layer of a chip produced on a semiconductor production wafer. The production of the patterned layer includes a lithography step and an etching step, where the lithographic mask applied for producing the patterned layer is provided with one or more asymmetric marks. The position of printed and etched mark features is sensitive to lithographic and etch parameters. Changes in these positions are measured by overlay measurements, i.e. the measurement of the change in position of one mark relative to another. The obtained 'pseudo' overlay data are fitted to a parametric model, while characteristic feature dimensions are measured on a test wafer. The inverted model allows determination of feature dimensions on a production wafer. Application of the method on two different layers allows determination of edge placement errors between features of the two layers.

16 Claims, 11 Drawing Sheets

(56) References Cited

U.S. PATENT DOCUMENTS

| | | |
|---|---|---|
| 10,020,166 B1* | 7/2018 | Monahan ............ H01J 37/3177 |
| 2005/0168716 A1 | 8/2005 | Ausschnitt |
| 2007/0050749 A1* | 3/2007 | Ye ............................. G03F 1/44 |
| | | 430/30 |
| 2007/0288219 A1* | 12/2007 | Zafar ........................ G03F 1/84 |
| | | 703/14 |
| 2012/0153281 A1 | 6/2012 | Ghinovker |
| 2012/0224176 A1 | 9/2012 | Hammond |
| 2013/0208279 A1 | 8/2013 | Smith |
| 2015/0161320 A1* | 6/2015 | Li ............................. G03F 1/36 |
| | | 716/54 |

* cited by examiner

  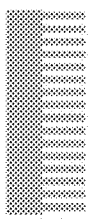 
FIG. 1a　　FIG. 1b　　FIG. 1c　　FIG. 1d
 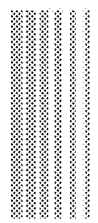 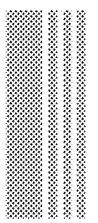 
FIG. 1e　　FIG. 1f　　FIG. 1g　　FIG. 1h
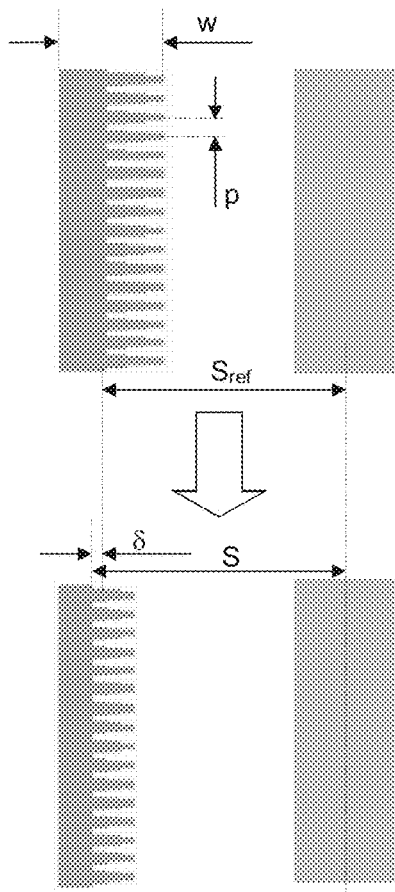 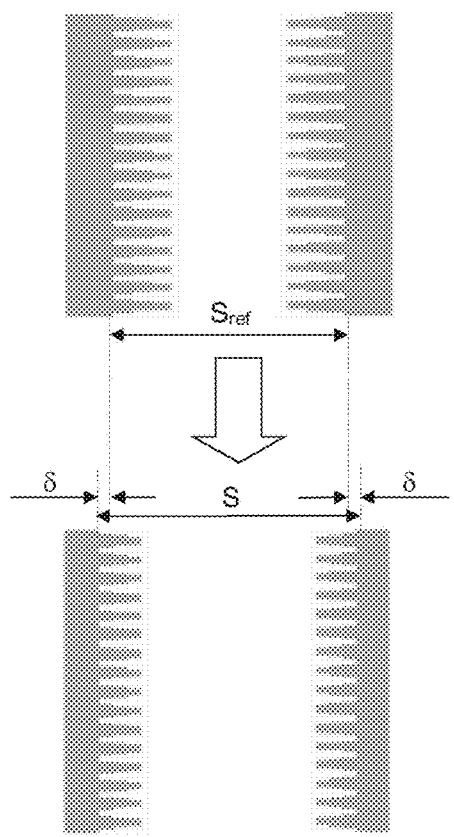
FIG. 2a　　FIG. 2b

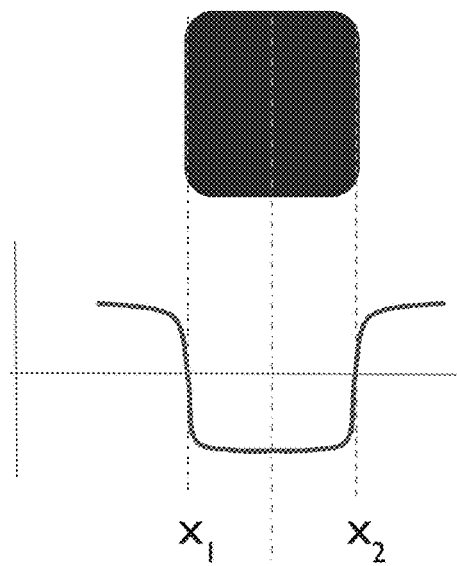
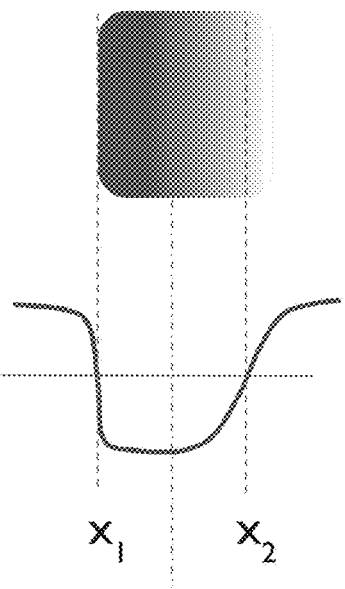
FIG. 3a          FIG. 3b
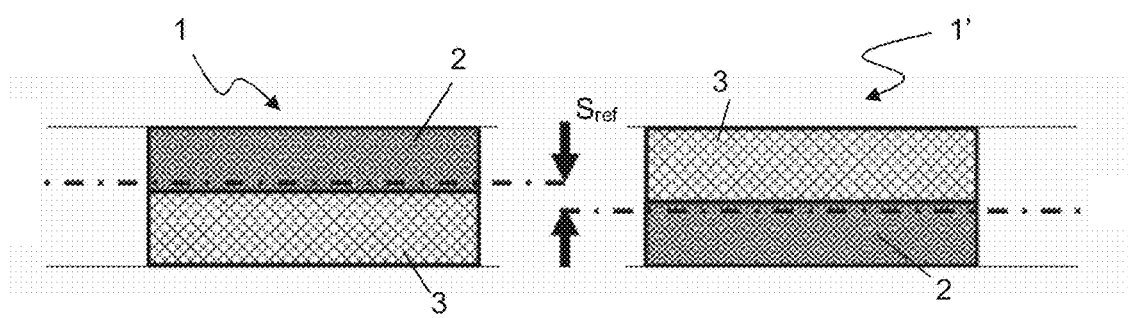
FIG. 4a
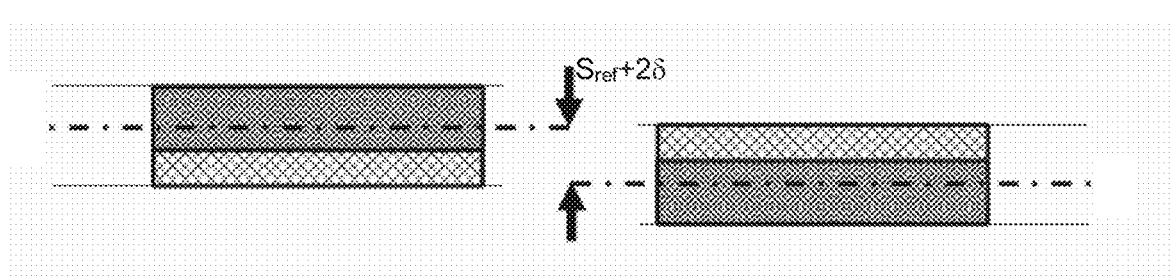
FIG. 4b

METHOD AND APPARATUS FOR SEMICONDUCTOR MANUFACTURING

CROSS-REFERENCE TO RELATED APPLICATIONS

The present application is a national stage application of International Patent Application No. PCT/EP2017/064145, filed on Jun. 9, 2017, which claims priority to (i) European Patent Application No. EP 17164311.7, filed on Mar. 31, 2017, and (ii) European Patent Application No. EP 16174048.5 filed on Jun. 10, 2016, all of which are incorporated herein by reference in their entirety.

FIELD OF THE DISCLOSURE

The present disclosure is related to semiconductor processing, in particular to a metrology method for monitoring lithographic and/or etch processes during the fabrication of a semiconductor chip.

BACKGROUND

Semiconductor processing can include many lithography and etch steps, where a pattern defined in a lithographic mask is exposed to a light source, resulting in the printing of the pattern on a photoresist film deposited on a layer stack that is built up layer by layer on a semiconductor wafer. After development of the resist, etching reproduces the pattern in a layer of the stack, for example for realizing a metal conductor pattern in a level of the back-end-of-line stack of an integrated circuit chip. Feature dimensions of the printed and etched patterns in present day processing technology are on the order of nanometers, and the monitoring of the printed/etched features can require specific metrology tools.

The dependence of the feature dimensions on a plurality of lithographic parameters has been the subject of intensive study. Methods for monitoring the litho-process can include establishing a parametric model that correlates dimensions of specific control patterns to the set values of dose and focus applied in the lithography tool. The measurement of dimensions of the control patterns can take place via Scanning Electron Microscopy (SEM), Atomic Force Microscopy (AFM), optical microscopy, or other means. The determination of feature dimensions by SEM or AFM is however time-consuming and often destructive. Also, the control patterns applied in this way are typically not design rule compatible. As a result, the influence of etch parameters on the manufactured pattern is generally not taken into account. There is a need therefore for alternative methods that allow a more reliable and more non-intrusive way of verifying a pattern after lithography and etching.

SUMMARY

This disclosure is related to a method for determining dimensions of features in a patterned layer of a chip produced on a semiconductor production wafer, i.e., a wafer used in a manufacturing process for producing multiple chips on the wafer. Within the present context, the term "production wafer" is typically distinct from a "test wafer" used in the calibration steps included in this disclosure. The production of the patterned layer includes a lithography step and an etching step, where the lithographic mask applied for producing the patterned layer is provided with one or more asymmetric marks which are design rule compatible, i.e. which are reproduced in the resist layer including fine elements of the marks. The position of printed and etched mark features is sensitive to lithographic and etch parameters. According to some embodiments, changes in these positions are measured by overlay measurements, i.e. the measurement of the change in position of one mark relative to another. In particular, optical overlay measurement is typically fast, non-destructive and, since overlay is intrinsically a differential, isolation from variation in the layers underlying the patterns of interest can be achieved. Current overlay measurement capability routinely exhibits single-Angstrom level precision. The obtained "pseudo" overlay data obtained on a Focus Exposure Matrix (FEM) wafer, possibly also including modulation of etch parameters, are fitted to a parametric model, while characteristic feature dimensions are measured on the FEM. The inverted model allows determination of feature dimensions on a production wafer. Application of the method on two different layers allows determination of edge placement errors between features of the two layers.

According to the disclosure, a method is provided for determining dimensions of features in a patterned layer of a chip produced on a semiconductor wafer, the production of the layer including a lithography step and an etching step, the lithography step including: applying a lithographic mask which defines a pattern of features and exposing a resist layer to a light source through the mask, thereby obtaining printed pattern features, the method comprising the steps of: including in the mask one or more asymmetric marks which result in printed mark features (i.e. in a printed mark pattern for each asymmetric mark) in the resist layer after the lithography step, and in etched mark features after the etching step, wherein: the position of the printed mark features depends on the set values of one or more lithographic parameters applied in the lithography step, the position of the etched mark features depends on the set values of one or more etch parameters applied in the etching step, determining on one or more test wafers, the position or a value representative thereof, of the printed and/or etched mark features, for a plurality of different "set" values of the lithographic and/or etch parameters, determining dimensions of one or more pattern features of the patterned layer for the same plurality of set values of the lithographic and/or etch parameters, determining one or more first parametric models correlating the position (i.e. a value representative of the position) of the printed and/or etched asymmetric mark features to the plurality of different set values of the lithographic and/or etch parameters, determining one or more second parametric models correlating the measured feature dimensions to the plurality of different values of the lithographic and/or etch parameters, inverting the one or more first parametric models.

The preceding steps are the calibration steps of the method. The following steps may be referred to as the "production steps" of the method. The calibration steps are performed once and result in the first and second parametric model and the inverted first model. The production steps may be applied at a plurality of locations on a plurality of chips produced on one or more production wafers: performing the lithography and etch steps on the production wafer and determining the position of the same printed and/or etched asymmetric mark features, calculating from the inverted first one or more models a set of "get" values of the lithographic and/or etch parameters, determining the dimensions of one or more characteristic features on the production wafer by applying the get" values to the one or more second parametric models.

The position of a printed or etched asymmetric mark feature or a value representative thereof is determined by determining the position of the centroid of the printed or etched mark pattern in the direction of asymmetry, or a position that is representative of the centroid position. A value representative of the centroid position is for example a distance of the centroid to an offset position, which may be the position of the centroid of a symmetric or asymmetric offset mark pattern equally included in the litho mask. A position representative of the centroid position for an asymmetric printed or etched mark pattern may be determined based on an intensity profile of an image of the mark pattern, in the direction of asymmetry. The centroid-representative position may be obtained by integrating the intensity profile with respect to a reference intensity value and determining the centroid of the area between the reference intensity and the profile.

According to an embodiment, the marks comprise at least one pair of a symmetric mark and an asymmetric mark or at least one pair of oppositely oriented asymmetric marks, and wherein in the method step "determining on one or more test wafers, the position or a value representative thereof, of the printed and/or etched mark features, for a plurality of different 'set' values of the lithographic and/or etch parameters," a value is determined that is representative of the position of the resulting pair of printed or etched mark features, the value being a function of the distance between the pair of printed or etched features, obtained by an overlay measurement, the value being termed a "pseudo overlay response." Typically, the distance is determined as the distance between the centroids of the pair of oppositely oriented asymmetric marks or of the pair of a symmetric mark and an asymmetric mark. The pseudo-overlay response may be a shift of the distance with respect to a reference value, or it may be distance itself.

According to an embodiment, the overlay measurement is an image based overlay (IBO) measurement. The overlay measurement may be based on the determination of the centroid of an image of the asymmetric mark, for example obtained by determining the edges of an intensity profile across the mark in the direction of asymmetry.

According to an embodiment, the marks are arranged in one or more IBO targets, located within or in the vicinity of the patterned layer, where one IBO target comprises a plurality of different asymmetric marks and/or a plurality of reproductions of the same asymmetric mark in different orientations, allowing one to obtain multiple pseudo-overlay responses as a function of the lithographic and/or etch parameters. According to an embodiment, one or more of the IBO targets comprises one or more cross-shaped or windmill shaped clusters of reproductions of the same mark arranged around a central point.

According to an embodiment, the overlay measurement is a diffraction based overlay (DBO) measurement. According to an embodiment, the marks are arranged in one or more DBO targets, located within or in the vicinity of the patterned layer, where one DBO target comprises a pair of interleaved gratings, each grating formed of two marks (A,B) arranged adjacently and in a repeated manner, at least one of the marks (A,B) being an asymmetric mark, and wherein the distance between two adjacent marks A and B is different in the first grating compared to the second grating, the difference between the distances being predefined. According to a further embodiment, a DBO target comprises two of the pairs of interleaved gratings, the first pair being oriented perpendicularly to the second pair.

According to an embodiment, additional feature dimensions in the patterned layer of the production wafer are determined by interpolation of a plurality of the characteristic feature dimensions.

According to an embodiment, at least some of the asymmetric marks comprise mark features, which are dimensioned and/or arranged in a manner to improve the type of response of the mark pattern's position or position-representative value to a change in one or more lithographic and/or etch parameters, so that at least one response exhibits a monotonic change as a function of one of the lithographic and/or etch parameters According to an embodiment, the chip is produced multiple times on one or more semiconductor production wafers, and the determination of the characteristic feature dimensions is done on a chip produced on the one or more production wafers, the characteristic feature dimensions are verified on the basis of a manufacturing tolerance, the verification results are used to calculate updated values of the lithographic and/or etch parameters, the updated values being configured to maintain the characteristic feature dimensions within the tolerance, the updated values are applied in the production of one or more subsequent chips.

The disclosure is furthermore related to a method for determining an edge placement error (EPE) between two features of two respective patterned layers of a semiconductor chip, comprising the steps of: determining the dimensions of the first and second feature by the above-described method, determining the overlay error between the first and second layer, determining the edge placement error on the basis of the overlay error, taking into account the dimensions of the first and second feature as determined in the first step.

According to an embodiment of the method for determining an EPE, the lithographic masks for producing the two layers comprise respective parts of a hybrid target, the first part comprising marks provided in the first mask, the second part comprising marks provided in the second mask, and wherein the measurement of the overlay error between the first and second layer is obtained from an overlay value measured between printed and/or etched mark features resulting from the first and second parts. The overlay error can be determined using either the relative layer-to-layer placement of symmetric marks on each layer or the relative layer-to-layer placement among the sum of the opposing asymmetric marks on each layer.

According to some embodiments, the chip is produced multiple times on one or more semiconductor production wafers, and the determination of the EPE is done on a chip produced on the one or more production wafers, based on the first and second parametric models determined by the calibration steps of the method, and verified on the basis of a manufacturing tolerance, the verification results are used to calculate updated values of the lithographic and/or etch parameters, the updated values being configured to maintain the EPE within the tolerance, the updated values are applied in the production of one or more subsequent chips.

According to some embodiments of any of the above-described methods, the lithographic parameters are the dose and defocus values and wherein the etch parameter is the etch bias.

According to embodiments, the lithographic mask comprises one or more IBO targets as described in any of FIGS. 4 to 10 and 16a, and any combination thereof, as well as any obvious variations thereof in terms of the number of marks, the number of mark types, the relative location of the marks with respect to each other, etc.

The disclosure is equally related to any IBO targets described in this specification. The disclosure is thus related to an IBO target comprising one or more cross-shaped or wind-mill shaped clusters of reproductions of the same mark arranged around a central point. The disclosure is furthermore related to IBO targets as described in any of FIGS. 4 to 10 and 16a, and any combination thereof, as well as any obvious variations thereof in terms of the number of marks, the number of mark types, the relative location of the marks with respect to each other, etc.

According to an embodiment, at least one of the IBO targets comprises a first group of asymmetric marks of which the uniform and periodic portions are arranged in a first direction, and a second group of the same asymmetric marks, of which the uniform and periodic portion are arranged in a second direction perpendicular to the first.

The disclosure is equally related to the DBO targets described in this specification. The disclosure is thus related to DBO targets as described in FIGS. 11b, 11c and FIGS. 12a and 12b, as well as any obvious variations thereof in terms of the number of marks, the number of mark types, the relative location of the marks with respect to each other, etc. According to an embodiment, a DBO target according to the disclosure comprises a pair of interleaved gratings, each grating formed of two marks (A,B) arranged adjacently and in a repeated manner, at least one of the marks (A,B) being an asymmetric mark, and wherein the distance between two adjacent marks A and B is different in the first grating compared to the second grating, the difference between the distances being pre-defined. According to a further embodiment, a DBO target according to the disclosure comprises two of the pairs of interleaved gratings, the first pair being oriented perpendicularly to the second pair.

The disclosure is also related to an apparatus for lithography and etching of features on a semiconductor wafer, wherein the apparatus comprises: a metrology tool configured to determine the position of a printed mark pattern and an etched mark pattern obtained from an asymmetric metrology mark included in a lithography mask applied in the apparatus, a computer-implemented verification unit comprising a memory provided with a computer program for executing at least the following steps, when run on the verification unit: acquiring through the metrology tool a plurality of position-representative values associated respectively to a plurality of asymmetric marks, calculating values of lithographic and/or etch parameters based on a first parametric model that links the position-representative values to the parameters, calculating characteristic dimensions of features on the wafer based on a second parametric model that links the lithographic and/or etch parameters to the characteristic dimensions, and evaluating the characteristic dimensions in comparison with a tolerance.

The verification unit may furthermore be configured to update one or more of the lithographic and/or etch parameters, as appropriate for the evaluation result. The metrology tool may be an IBO tool or a DBO tool. The verification unit may comprise a memory provided with a computer program for executing the steps, when the program is run on the verification unit.

The disclosure is also related to a computer program product applicable in the verification unit of the disclosure, and configured to execute the steps, when the program is run on the verification unit.

BRIEF DESCRIPTION OF THE FIGURES

FIG. 1a shows marks, according to an example embodiment.

FIG. 1b shows marks, according to an example embodiment.

FIG. 1c shows marks, according to an example embodiment.

FIG. 1d shows marks, according to an example embodiment.

FIG. 1e shows marks, according to an example embodiment.

FIG. 1f shows marks, according to an example embodiment.

FIG. 1g shows marks, according to an example embodiment.

FIG. 1h shows marks, according to an example embodiment.

FIG. 2a illustrates how marks can be used to measure a pseudo-overlay value, according to an example embodiment.

FIG. 2b illustrates how marks can be used to measure a pseudo-overlay value, according to an example embodiment.

FIG. 3a illustrates how the centroid of a mark may be determined by an image based overlay (IBO) tool, according to an example embodiment.

FIG. 3b illustrates how the centroid of a mark may be determined by an image based overlay (IBO) tool, according to an example embodiment.

FIG. 4a shows IBO targets, according to an example embodiment.

FIG. 4b shows IBO targets, according to an example embodiment.

DETAILED DESCRIPTION

Figures 5A, 5B:
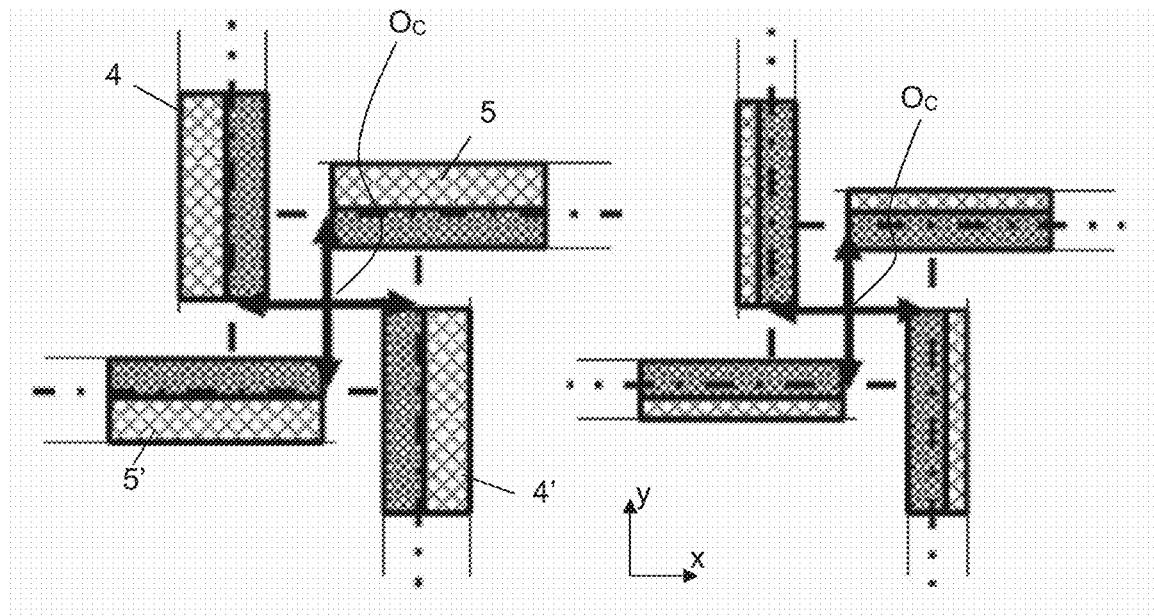
FIG. 5a shows IBO targets, according to an example embodiment.
FIG. 5b shows IBO targets, according to an example embodiment.

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

According to embodiments of the disclosure, the lithographic mask used for the production of a patterned layer is provided with one or more metrology targets, each target comprising at least one asymmetric mark. In some embodiments, the target comprises at least one pair of a symmetric mark and an asymmetric mark, and/or one or more pairs of oppositely oriented, possibly mirrored asymmetric marks. Within the present context, a "mark" can be defined as a predefined pattern designed for metrology purposes. A target comprises one or more marks and is included inside or in the vicinity of the area of the mask that contains the actual pattern that is to be printed. Typical examples of symmetric and asymmetric marks are shown in FIGS. 1a-h, which illustrate marks of the comb type, both symmetric (FIG. 1a) and asymmetric (FIGS. 1b-1d) and of the rail type, equally symmetric (FIG. 1e) and asymmetric (FIGS. 1f-1g). The asymmetric marks of this type are known as such, as well as the fact that features printed by lithography according to these patterns are sensitive to modulations of various lithography parameters. The present disclosure applies this characteristic in a method that is applicable for monitoring lithographically printed features in a semiconductor chip production line, and also for monitoring features obtained after etching. For this reason, the symmetric and asymmetric marks applied in this disclosure are generally to be design rule compatible, meaning that the marks are dimensioned and designed so that fine-pitched features of the patterns, such as the fine-pitched teeth of the comb-type marks, can be transferred to a resist layer, so that the fine-pitched pattern can further be transferred to an underlying layer, by an etch process. Note that the asymmetric marks can be further segmented in the direction transverse to the comb or rail to maintain design rule compatibility on layers comprised of two-dimensional patterns; e.g., contact or block layers.

The two lithographic parameters that are used in this disclosure are the dose and defocus values, de-focus being the deviation from a pre-defined zero-defocus setting on the exposure tool, expressed for example in nm. Dose is defined as the energy applied through the mask during exposure, expressed for example in mJ/cm². Both defocus and dose are values that can be set on the lithography tool. These dose and defocus set values are hereafter referred to as "Eset" and "F set" respectively, or simply "E" and "F." The etch parameter used in the present description is the etch bias, which refers to the difference in the lateral dimension between the etched image and the lithographically printed image. The determination of the etch bias E generally involves a well-defined lithographically printed feature. A "set" value of the etch bias is referred to in the present description as "Bset" or "B," expressed for example in nm. The etch bias can be set by applying specific settings to control parameters during the etch process, like etch time, etch rate, voltage, chamber pressure etc. It is pointed out that other parameters may be used instead of or in addition to dose, defocus and etch bias.

First, a number of configurations of marks will be explained. According to embodiments of the disclosure, the position of printed or etched mark features obtained from an asymmetric mark is to be understood as the position of the centroid of the mark pattern obtained after litho or etch respectively, in the direction of asymmetry (i.e. the direction perpendicular to the longitudinal direction of the mark in the case of elongated marks as shown in the drawings). The centroid is the center line of the integrated area of a mark pattern (either symmetric or asymmetric), i.e. the area covered by the printed or etched mark pattern is the same to the left and to the right of the centroid. In embodiments, the position of a printed and/or etched asymmetric mark pattern is expressed in terms of the distance from the centroid of the mark pattern to an offset position that is either independent from the litho and etch parameters or that itself changes in a similar way as the mark pattern, as a function of the parameters. According to an embodiment, the offset position is itself defined by a symmetric or an asymmetric mark included in the litho-mask. The offset asymmetric mark may be the mirror image of the mark of which the position is being determined. The target then comprises one or more mark pairs, designed for metrology purposes.

FIG. 2a shows a target comprising a pair of a symmetric mark and an asymmetric comb-type mark. FIG. 2b shows a target comprising a pair of two mirrored asymmetric comb-type marks. In each of the FIGS. 2a and 2b, a view is shown at the top of the figures, of the as-designed shape of the marks. The distance $S_{ref}$ between the centroids of the two marks is the distance obtained when the marks are reproduced in an essentially ideal way by litho or etch: the width w of the mark, the pitch p, and the shape and dimensions of the comb features is exactly according to the design of the mark. These ideal process conditions are hereinafter also referred to as the nominal process conditions. After the lithography step, illustrated at the bottom of the figures, these marks result in printed reproductions of the marks in a resist layer, i.e. printed mark features. As the marks are design rule compatible, they are equally reproduced after etching, for example in the form of trenches in a layer underneath the resist ("etched mark features"). The printed and etched reproductions depend on the process parameters such as E, F, and B. When these parameters differ from the ideal set of parameters, the dimensions of the reproduced mark patterns differ from the as-designed values, as is illustrated in FIG. 2b. The position of the centroid of a printed or etched symmetric mark pattern is nevertheless insensitive to changes in E, F and B, as a consequence of the symmetry. Due to its asymmetric structure, the position of the centroid of a printed or etched asymmetric mark pattern shifts in the direction perpendicular to the longitudinal direction of the mark, as a function of changes in E, F and B. The shift is indicated as a function δ(E,F,B) in FIGS. 2a and 2b. When two mirrored asymmetric marks are used, the shift between the two equals 2δ. The distance S between the centroids is equally indicated in the drawings. δ and 2δ are obtained as:

δ=S−$S_{ref}$ in the case of FIG. 2a
2δ=S−$S_{ref}$ in the case of FIG. 2b

In embodiments, the position of asymmetric marks is determined by detecting and measuring the shift δ or 2δ by metrology tools known as such in the art for measuring overlay errors, i.e. measurements for determining the shift between two different layers produced by different lithographic masks and caused by an overlay error between the masks applied for printing the two layers. Because the shift is now measured in a single layer, the measured shift is referred to in the present context as a "pseudo-overlay value" or "pseudo-overlay response," as the value responds to (is sensitive to) the litho and etch parameters used for printing and etching the mark features. The pseudo-overlay response will hereafter be expressed by the letter O. Instead of the shift δ or 2δ, the distance S itself can be measured and used as a pseudo-overlay response. The pseudo-overlay response can take the form of a value representative of the position of a printed and/or etched asymmetric mark pattern. The pseudo overlay response can be measured by image based overlay (IBO) tools or diffraction based overlay (DBO) tools. These tools are known for the measurement of overlay errors. The layout of the marks will be different in each case as will be explained hereafter.

An IBO target can consist of a plurality of marks of the types as shown in FIGS. 2a and 2b, distributed across the field of view (FOV) of the IBO tool. The printed features have an overall width "w" that is resolvable by the IBO tool. For example, "w" may be of the order of 500 nm. The fine comb structure has a pitch "p" that is not resolvable by the IBO tool, e.g., "p" is on the order of 100 nm. The IBO tool is thus able to determine the relative distance between the centroids of the target features, as illustrated in FIGS. 3a and 3b which illustrate the image as seen by the IBO tool of a symmetric mark pattern and an asymmetric comb-type mark pattern, as well as the intensity profile as a function of the position in the direction perpendicular to the mark pattern. As the fine pitch p is not resolvable by the IBO tool, the tool sees an asymmetric intensity profile across the mark in the direction of asymmetry. It can approximate the centroid position $X_C$ by measuring the relative position of the edges of the intensity profile at a given intensity setting $I_{set}$, i.e., $X_C=(X_1+X_2)/2$. A typically more accurate way of determining the centroid position is by integrating the intensity profile with respect to a reference value $I_{ref}$ i.e. calculating the area between $I_{ref}$ and the intensity profiles, and determining the centroid of the profiles, i.e. the location of the centroid line so that the calculated areas to the left and right of the line are the same. Because the centroid position is based on the image, it may differ from the mathematical centroid position of the printed or etched mark pattern as defined above in relation to FIGS. 2a and 2b. The measured shift δ or 2δ of the image centroid will however be proportional to the mathematical centroid shift when measured by the IBO tool. Metrology targets comprising at least one pair of oppositely oriented asymmetric marks or a pair of a symmetric mark and an asymmetric mark, as shown in FIGS. 2a and 2b, are hereafter referred to as IBO targets.

FIGS. 4a and 4b show an IBO target that takes up a minimal portion of the printed or etched area. The area of the printed target may be about 2 square microns. The target comprises two marks 1 and 1' of the same asymmetric design and rotated 180° one with respect to the other. The marks may be any of the asymmetric types shown in FIG. 1. The asymmetry of the marks is illustrated in a symbolic way by a distinct hatching type of portions 2 and 3 to indicate a pattern density gradient across the two regions. For example, for a comb type mark, portion 2 is a full rectangle and portion 3 is an array of comb features. The marks are positioned side by side along their longitudinal direction (i.e. the direction of the dividing line between the differing pattern densities of portions 2 and 3). FIG. 4a shows the as-designed printed or etched marks (obtained at nominal process conditions): the distance between the centroids is $S_{ref}$. When the process conditions are perturbed and thereby deviate from the nominal conditions, a shift 2δ between the centroids can be detected by an optical IBO tool (see FIG. 4b).

Figures 6A, 6B:
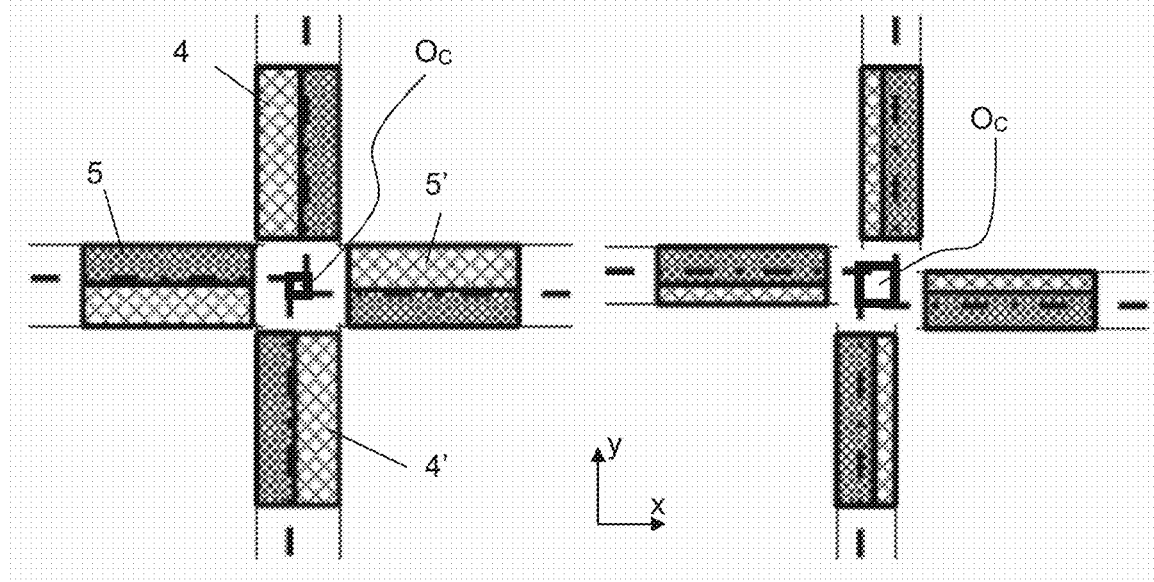
FIG. 6a shows IBO targets, according to an example embodiment.
FIG. 6b shows IBO targets, according to an example embodiment.

Other types of IBO targets are illustrated in FIGS. 5a, 5b, 6a, and 6b. They each comprise two pairs of mutually oppositely oriented asymmetric marks 4/4' and 5/5', arranged in a windmill pattern (FIGS. 5a-b) or a cross pattern (FIGS. 6a-b). The four marks are all reproductions of the same mark design. The centroid shift 2δ can thereby be measured in two orthogonal directions x and y. It is seen that the four centroids of the four marks form a rectangle with a fixed center $O_C$, regardless of whether the nominal process conditions (FIGS. 5a and 6a) or perturbed process conditions (FIGS. 5b and 6b) are applied. This characteristic, namely the fact that the point $O_C$ is fixed in a particular layer, can be used to detect an overlay error between two layers applied in the process. When the IBO target of FIG. 5a, 5b, 6a, or 6b is included at the same location in two masks applied consecutively in the process, the IBO tool can detect the shift of the point $O_C$ between the two layers, and thereby detect an overlay error in two orthogonal directions. It is to be noticed that the midpoint (line) between the centroids in the target of FIGS. 4a and 4b is a fixed line, and can thus be used to determine overlay errors in one direction. The area of printed/etched surface taken up by the targets of FIGS. 5a, 5b, 6a, and 6b may be about 4 square microns.

Figures 7A, 7B:
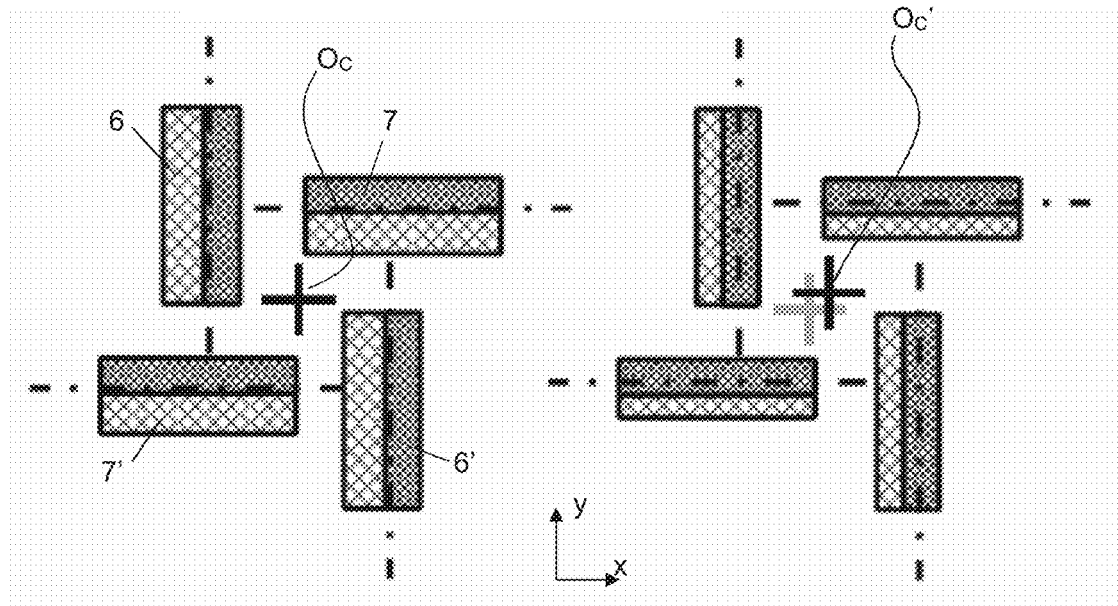
FIG. 7a shows IBO targets, according to an example embodiment.
FIG. 7b shows IBO targets, according to an example embodiment.

FIG. 7a shows yet another IBO target formed by a mark cluster as printed under nominal conditions. Again the design is a windmill cluster of asymmetric marks of the same design, but this time each of the two pairs of marks 6/6' and 7/7' extending in x and y direction respectively are formed of 2 marks (6 and 6' for one pair and 7 and 7' for the second pair) which have the same orientation. As a consequence, when the process is perturbed (FIG. 7b), the center $O_C$ of the rectangle formed by the centroids shifts to a new position $O_C'$. In order to measure the shift 2δ, a 180° oriented version of the windmill cluster of FIG. 7a can be used.

Figures 8A, 8B:
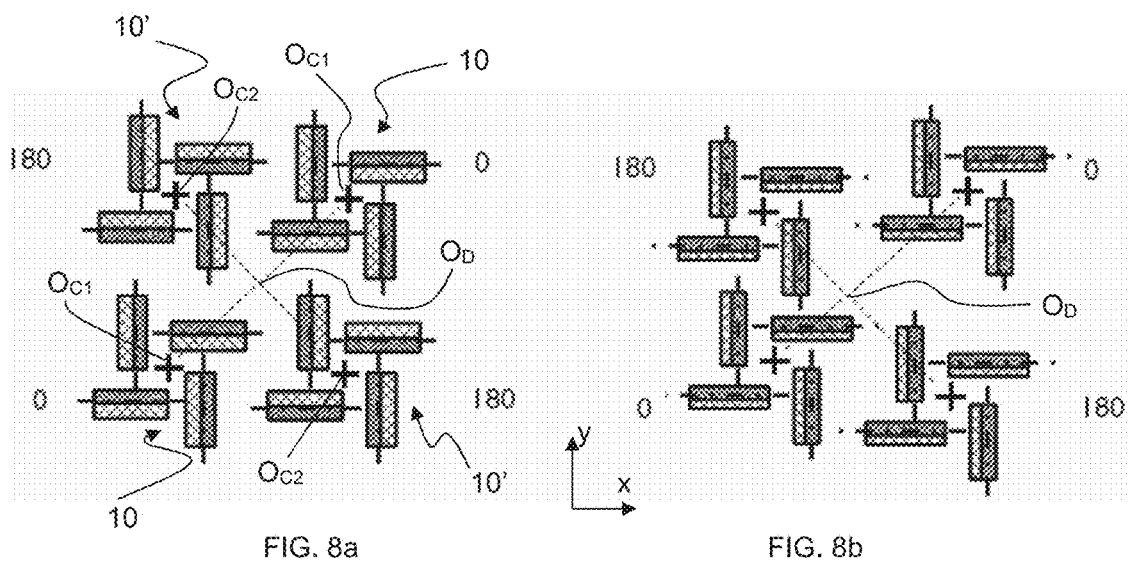
FIG. 8a shows IBO targets, according to an example embodiment.
FIG. 8b shows IBO targets, according to an example embodiment.

FIG. 8a shows a target design comprising the cluster 10 of FIG. 7a repeated in the upper right and lower left quadrant of the target layout, and a 180° rotated version 10' of the cluster in the two remaining quadrants (upper left and lower right). This target allows measurement of the centroid shifts in two directions by measuring the relative movement of the center points $O_{C1}$ with respect to the center points $O_{C2}$. The center point of the four clusters $O_D$ however remains fixed regardless of perturbations from the nominal process, and can thus be used for actual overlay measurements between printed/etched layers in the manner described above.

Figure 9:
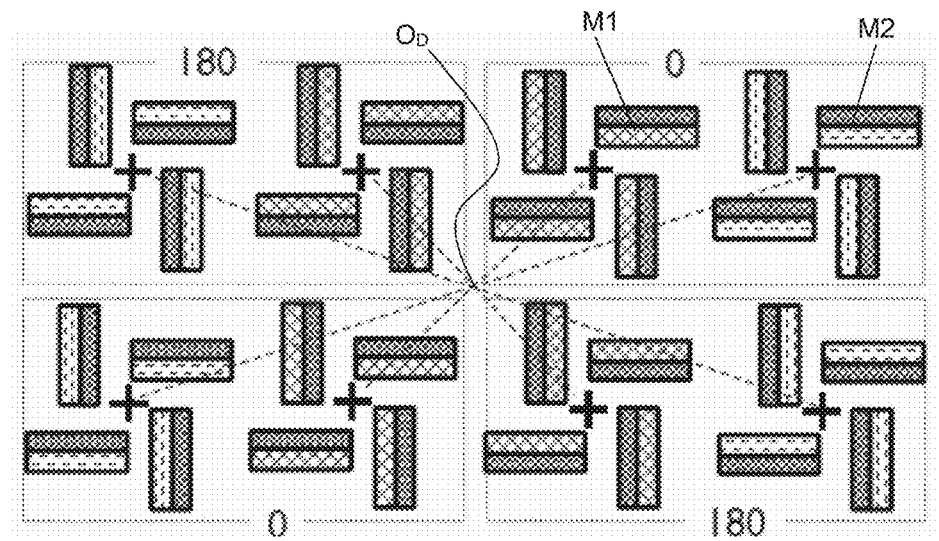
FIG. 9 shows IBO targets, according to an example embodiment.

FIG. 9 finally shows a similar target design as in FIGS. 8a and 8b, but wherein two different mark types M1 and M2 are applied, for example a comb type and a rail type, thereby allowing to distinguish two different E,F,B responses in x and y directions (e.g., four pseudo-overlay responses in total). The center point $O_D$ is again usable for overlay measurements.

Figure 10:
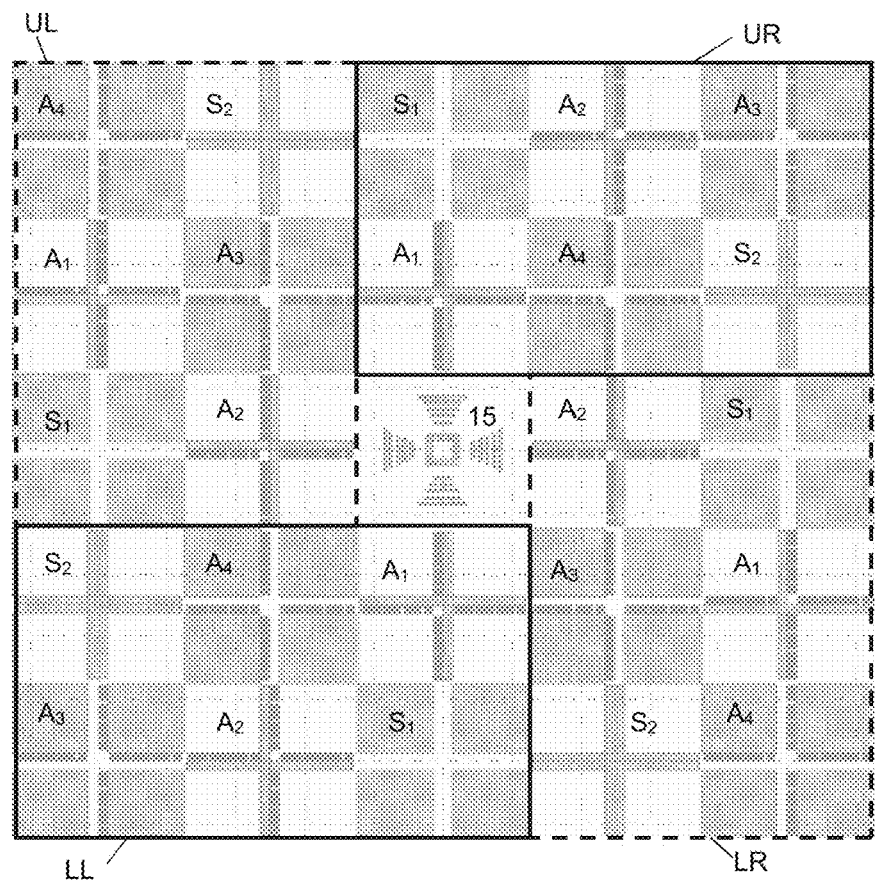
FIG. 10 shows IBO targets, according to an example embodiment.

FIG. 10 shows a further example of an IBO target. The marks included in the IBO target shown are arranged in a matrix of 24 x- and y-directed crosses that fit within the field-of-view (FOV) of the IBO tool, where the FOV center is denoted by a unique pattern recognition mark 15. Asymmetric mark-crosses $A_1$, $A_2$, $A_3$ and $A_4$ are identified in FIG. 10, as well as symmetric mark-crosses $S_1$ and $S_2$. Each of the asymmetric mark-crosses $A_1$-$A_4$ comprises 4 identical marks (i.e. reproductions of the same mark design) oriented so that the center point of the cross shifts as a function of the process parameters (as in FIGS. 7a and 7b). But the marks in the four crosses $A_1$-$A_4$ are all distinct. It is seen that the asymmetry of the asymmetric marks $A_1$-$A_4$ in the upper right (UR) and lower left (LL) target quadrants is opposite that of the marks in the upper left (UL) and lower right (LR) target quadrants. A set of 4 crosses consisting of marks of a particular asymmetric design (for example the 4 $A_1$ crosses in the four quadrants) then defines a specific (E, F, B) response in both x and y directions. A potential advantage of the IBO target is that it enables the simultaneous capture of multiple (E, F, B) responses within one target. In the example of FIG. 10, the two sets of symmetric marks $S_1$ and $S_2$ are usable as a reference. This leaves the 4 sets of 4 asymmetric marks $A_1$-$A_4$, usable to differentiate 4 different (E, F, B) responses in both x and y directions (i.e. 8 pseudo-overlay responses).

Figure 11A:
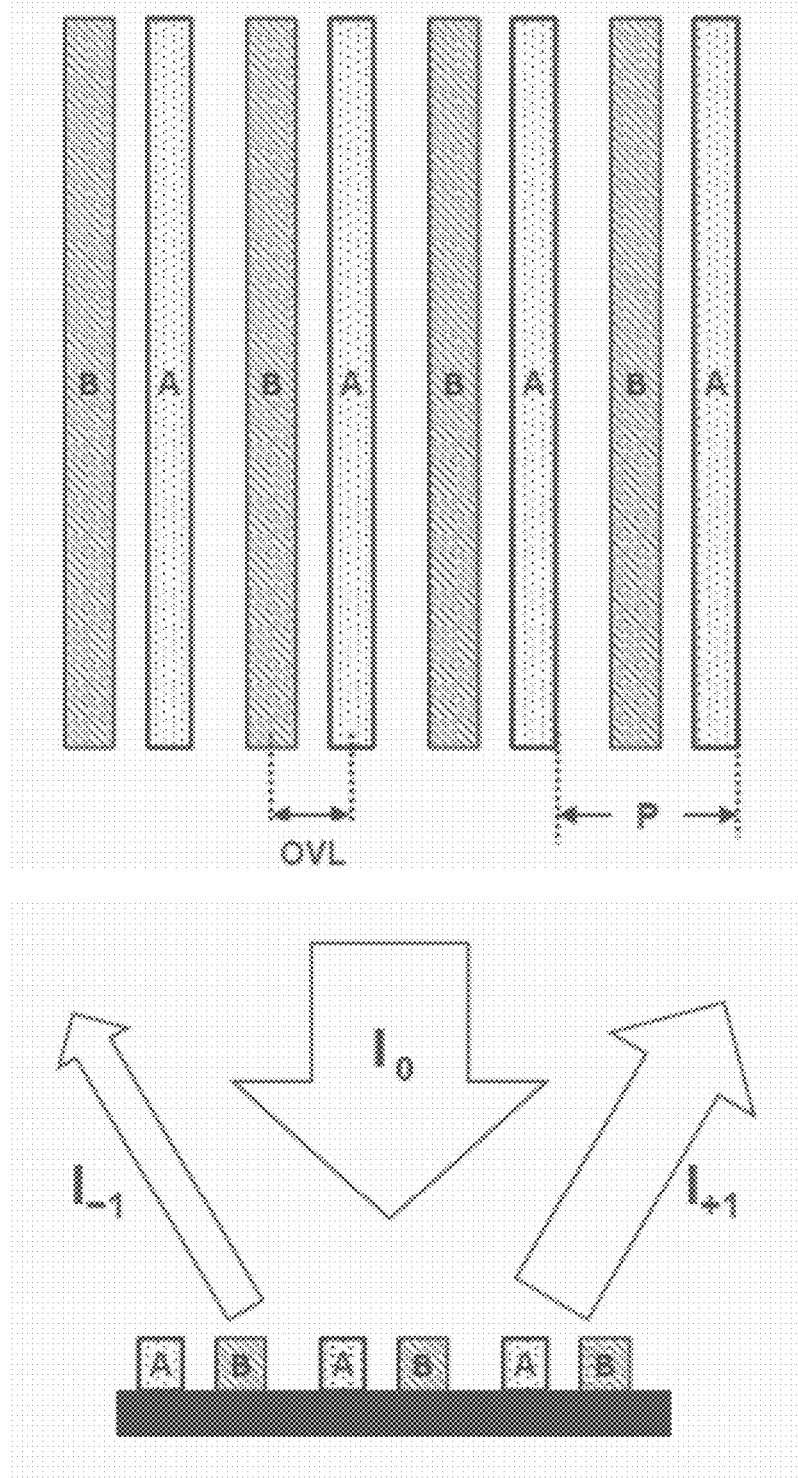
FIG. 11a shows a DBO target for the measurement of overlay errors, according to an example embodiment.

As an alternative to IBO targets, diffraction based overlay (DBO) targets can be applied. FIG. 11a shows the layout of a DBO overlay target as known in the art, formed of an arrangement of optically distinct elements (A,B) in an interlaced diffraction grating configuration with a pitch "P," typically on the order of 500-1000 nm. In other words, a first grating consisting of elements A is interlaced with a second grating consisting of elements B. Within each period "P" are the repeating elements (A,B). The grating elements A and B must be sufficiently different to cause a measurable difference between the plus and minus first order diffracted intensity $\Delta I = I_{+1} - I_{-1}$. This intensity difference is measured in a DBO overlay tool. It is a measurement for the overlay value OVL which allows determining overlay errors when the elements A and B are printed through different lithography masks.

Figures 11B, 11C:
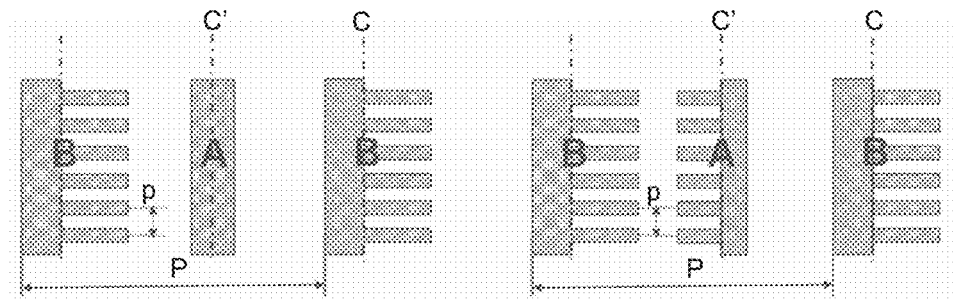
FIG. 11b shows the structure of gratings of a diffraction based overlay (DBO) target, according to an example embodiment.
FIG. 11c shows the structure of gratings of a diffraction based overlay (DBO) target, according to an example embodiment.

A DBO target can include a similar interlaced grating configuration, but with elements A and B included in the same lithographic mask. In the terminology of the present disclosure, elements A and B are referred to hereafter as marks. In addition, at least one of the marks A or B is asymmetric in the sense described above. FIGS. 11b and 11c show two examples of the layout of such a DBO target. In the first example (FIG. 11b), mark A is symmetric and mark B is asymmetric: it is a comb mark comprising a fine structure arranged at a maximum pitch p<<P that precludes diffraction induced by the fine structure itself, which could confound or detract from the diffraction from the grating elements at the coarse pitch P. FIG. 11c shows an example where both A and B are asymmetric. A and B cannot be mirror images however: they must have dimensions sufficiently different to cause a measurable difference in the plus and minus first order diffracted intensity. The marks applied in at least one grating must be asymmetric in order for patterning process conditions (E, F, B) to induce a relative movement of the centroids C of the asymmetric marks B of one printed and/or etched grating with respect to the centroids C' of the marks A of the symmetric grating (FIG. 11b) or with respect to the centroids C' of the marks A of the opposing asymmetric grating (FIG. 11c). Such relative movements cause a proportional change in the relative intensity of the plus and minus first order diffraction from the gratings. Thus, a DBO tool can measure an (E, F, B) response by measuring that intensity difference on a printed or etched version of the DBO target, formed of the gratings comprising the printed or etched marks A and B.

Figure 12A:
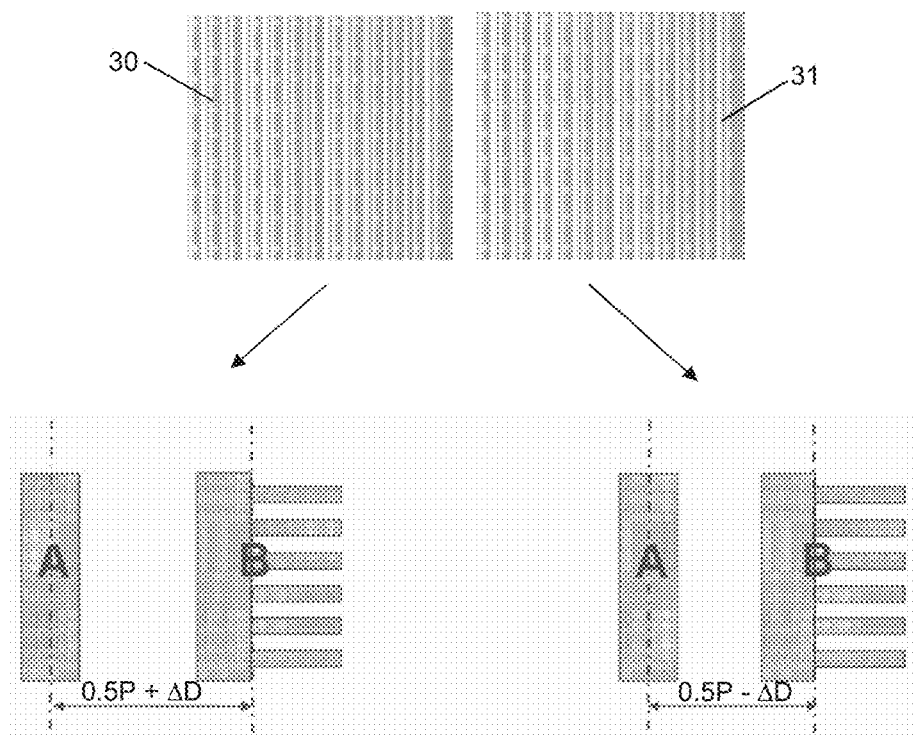
FIG. 12a shows the layout of a DBO target adapted to determine a pseudo-overlay response, according to an example embodiment.

In order to determine the shift of the distance S between two adjacent marks A and B within an interleaved grating, a DBO target is provided (see FIG. 12a) that comprises two gratings 30 and 31 formed by the same marks A and B but with a well-defined difference in the distance between two adjacent marks A and B. The period P is the same for both gratings 30 and 31. In grating 30, the "as designed" distance between the centroids of two adjacent marks A and B is $0.5P+\Delta D$. In grating 31, this distance is $0.5P-\Delta D$. The shift $\Delta D$ is a well-defined value that is significantly smaller than 0.5P so that gratings 30 and 31 represent slightly shifted versions of the grating with $\Delta D=0$. When the target is printed or etched, the centroid position of the asymmetric mark B will be shifted over a distance δ, as explained with reference to FIG. 2. This means that: the distance between the printed or etched mark patterns A and B in grating 30 is $0.5P+\Delta D+\delta$, and the distance between the printed or etched mark patterns A and B in grating 31 is $0.5P-\Delta D+\delta$.

The intensity differences 411 and 412 are measured on the printed or etched versions of the two gratings, using a DBO tool. These parameters are proportional to the values $\Delta D+\delta$ and $-\Delta D+\delta$ via a diffraction coefficient κ:

$$\Delta I_1 = \kappa(\Delta D + \delta)$$

$$\Delta I_2 = K(-\Delta D + \delta)$$

Solving κ and δ from these equations leads to:

$$\kappa = (\Delta I_1 - \Delta I_2)/2\Delta D$$

$$\delta = \Delta D(\Delta I_1 + \Delta I_2)/(\Delta I_1 - \Delta I_2)$$

Figure 12B:
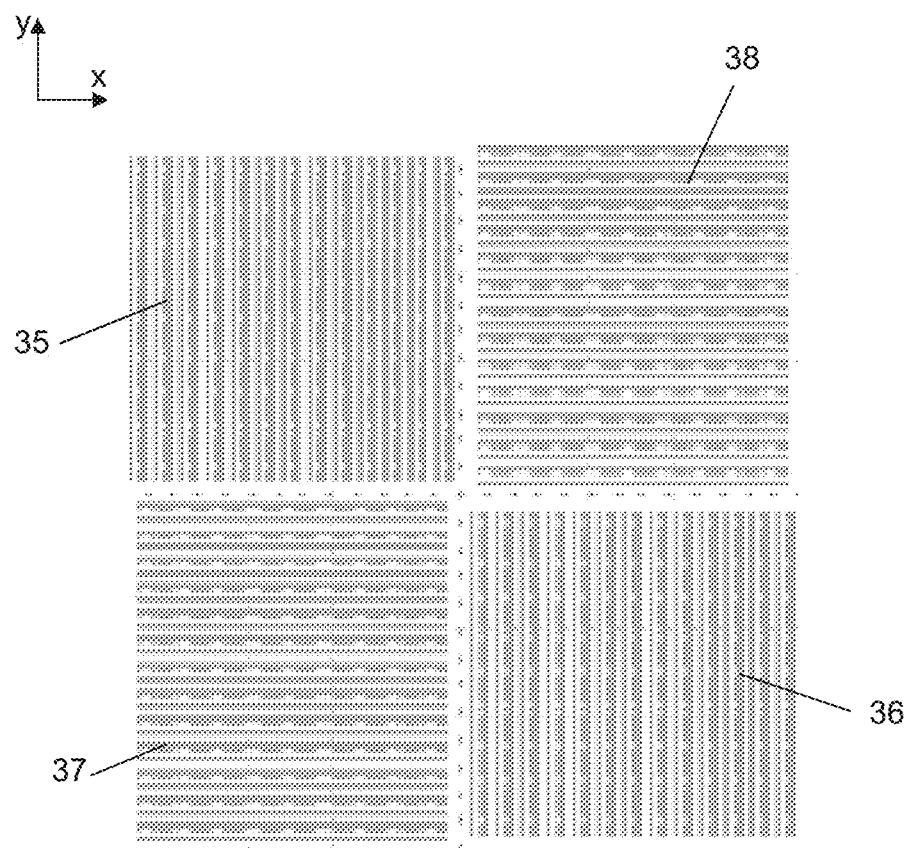
FIG. 12b shows an example of a DBO target designed for obtaining a response in 2 orthogonal directions, according to an example embodiment.

The latter equation allows one to determine the pseudo-overlay response δ on the basis of a measurement of $\Delta I_1$ and $\Delta I_2$. A typical DBO target layout is shown in FIG. 12b. The target comprises two pairs of gratings. The first pair 35,36 has marks A and B with the direction of asymmetry of the asymmetric mark B in the x-direction and with the shifts $+\Delta D$ and $-\Delta D$ applied between the positions of marks A and B (i.e. identical to the gratings 30 and 31 of FIG. 12a). The second pair 37,38 are the same as 35,36 but rotated over 90°. The set of 4 gratings is therefore designed to measure one (E,F,B) response in the x and y directions (i.e. two pseudo-overlay responses δ, one in x and one in y direction). DBO targets therefore have the potential disadvantage compared to IBO targets that they can require a larger area of the mask if multiple responses in multiple orientations are required.

So according to some embodiments of the disclosure, a lithographic mask for producing a given pattern is provided with one or more IBO and/or DBO targets as described above, each target providing one or more (E,F,B) responses in the form of pseudo-overlay values $O_1$ to $O_n$. In order to establish the relation between $O_1 \ldots O_n$ and the set values of E, F and B, a calibration procedure is performed. The procedure will be described in detail for the calibration with regard to dose and defocus only, but the method is analogous when the etch bias is included.

As an example, an IBO target may be provided that permits the measurement of a total of n pseudo overlay values $O_1 \ldots O_n$ (for example 4 in x direction and 4 in y direction in the case of the target of FIG. 10), which are a function of dose and defocus settings. In order to determine the functions, a calibration procedure is performed on one or more test wafers, known as Focus Exposure Matrix (FEM) wafers. On such a test wafer, consecutive prints are made in a resist layer, each print being made with a different value of the set dose value Eset and the set de-focus value $F_{set}$. For example, the de-focus value may be incremented in constant steps for a number of constant dose settings, the latter equally being incremented in constant steps. The ranges for the dose and defocus settings may be based on preliminary simulations for example. In each print, the values of $O_1 \ldots O_n$ are measured in an overlay measurement tool as described above. This results in a data set wherein $O_1 \ldots O_n$ can be set out as data points in a graph, as a function of E and F.

In addition to this, the dimensions of a number of features within the printed pattern are equally measured in each print on the FEM wafer. These features are selected within the pattern, e.g., in the vicinity of the target or targets. Features are selected which determine the functionality of the chip, i.e. when these features are not produced according to a predefined manufacturing specification, the chip will or is very likely to malfunction. In the present disclosure, these selected features are referred to as characteristic features. Alternatively or in addition to the measurement of characteristic feature dimensions on the printed pattern, the dimensions may be measured after etching the pattern at a given value of the etch bias. These dimensions may be measured by any suitable technique, such as SEM, AFM or the like. A total of m of these measurements yields a set of data $CD_1 \ldots CD_m$, as a function of E and F.

A first parametric model is then fitted to the pseudo overlay data $O_1 \ldots O_n$. In other words, mathematical functions $O_1=f_1(E,F) \ldots O_n=f_n(E,F)$ are determined which represent the best approximation of the measured overlay data.

A second parametric model is fitted to the characteristic feature dimension data i.e. mathematical functions $CD_1=d_1(E,F) \ldots CD_m=d_m(E,F)$ are determined which represent the best approximation of the measured feature dimension data.

The first parametric model is then inverted. This is a mathematical operation, yielding functions $E_{get}=F(O_1, \ldots, O_n)$ and $F_{get}=G(O_1, \ldots, O_n)$. The dose and defocus values are labeled $E_{get}$ and $F_{get}$ in order to distinguish them from the set values applied initially. The "get" values are the dose and focus values derived from overlay measurements on a particular target. $E_{get}$ and $F_{get}$ may differ from the set values due to the model approximation and due to other factors such as measurement noise and/or process variation on the FEM wafer that maps onto effective dose/focus or errors in the dose/focus settings.

According to the disclosure, the inverted first model and the second model are subsequently used for determining dimensions of the characteristic features on a production wafer, i.e. during the production of a chip comprising a layer that is printed and etched using the same mask, including the same targets used in the calibration. When the layer is printed and etched on the production chip, the n overlay values $O_1 \ldots O_n$ are measured by an overlay tool. These values are used for calculating $E_{get}$ and $F_{get}$ using the inverted first parametric model, which are subsequently entered in the second parametric model to calculate the characteristic feature dimensions $CD_1(E_{get},F_{get}) \ldots CD_m(E_{get},F_{get})$ on the production chip. The feature dimensions are thereby determined without requiring potentially destructive measurements such as SEM and AFM on the production chip.

When the etch bias B is taken into account as a parameter in the model, the above-described methodology is the same. The calibration data as a function of B will generally be gathered on the same or further FEM wafers, onto which the previously produced resist patterns are transferred by etching into an underlying layer. On consecutive dies of the FEM wafer, the settings of the etch tools are configured so that each die or each group of dies is etched with a different etch bias B. Measurement of the pseudo-overlay of the FEM wafer(s) after etching now yields a data set of $O_1 \ldots O_n$ as a function E,F and B. A parametric model can be fitted to this data in an analogue manner as described above. Possibly pseudo-overlay data could also be gathered after litho and before etching. A first parametric model can then be built as a function of dose and defocus based on the pre-etch pseudo overlay and another first parametric model can be built based on the post-etch data, as a function of dose, defocus, and etch bias. Another embodiment would entail basing the calibration on the etch bias B only, and not on E and F. As indicated already, the characteristic feature dimensions $CD_1 \ldots CD_m$ may be measured on the printed pattern or on the etched pattern or on both. When measured on both, the second parametric model will in fact be determined both for the printed features and for the etched features. Instead of or in addition to E, F and B, any number of other lithography and etch parameters can be used in the method. For example, systematic conditions that affect imaging in resist can take the form of aberration of lens systems and scan stability in the litho tool, resist thickness and bake plate temperature in the resist processing tool, as well as systematic conditions that affect the transfer of the resist image by etch, such as the pressure, voltage, gas mix of the etch reactor and pattern loading effects on the wafer.

The characteristic feature dimensions obtained on the production chip by the method of the disclosure may be fed back to a control unit incorporated in or connected to the lithographic and/or etching tools applied in the production process, where they are verified on the basis of a given manufacturing tolerance with respect to theoretical values. The verification allows the calculation of updated values of the processing parameters used in the first and second parametric models (E,F,B). These updated values help ensure that the characteristic dimensions on subsequent production chips stay within the manufacturing tolerance. Any known control algorithm and control hardware may be applied for realizing the above-described control strategy. The control strategy is typically applied by performing the feedback and update of the processing parameters on the basis of sample measurements rather than on measurements taken on each chip on the production wafer, i.e. the characteristic dimensions are determined by the method of the disclosure on a limited number of chips, each determination allowing updating the processing parameters applied in producing one or more subsequent chips.

Figure 13:
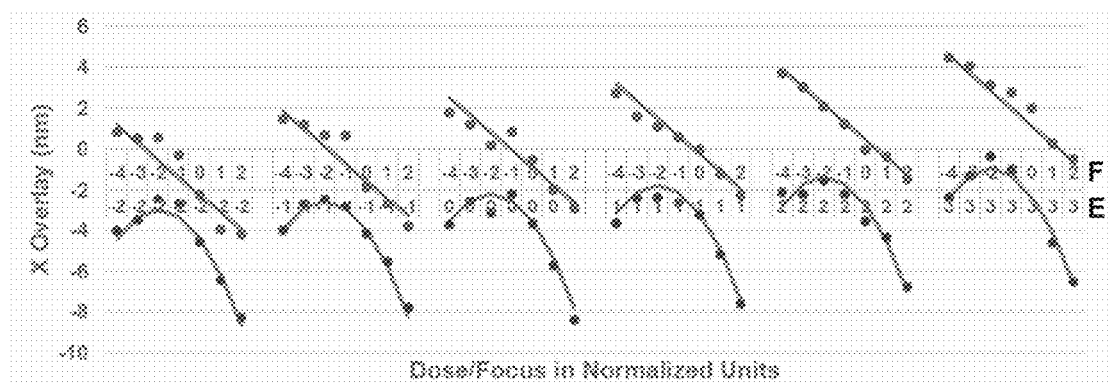
FIG. 13 shows pseudo-overlay data points as a function of dose and defocus for two different asymmetric marks, as well as the best fit of a parametric model based on the data points, according to an example embodiment.

By way of example, FIG. 13 shows a data set obtained from an IBO target having two different asymmetric marks, a comb pattern as shown in FIG. 1b and a dagger pattern as shown in FIG. 1c. So overlay measurements $O_C$ and $O_D$ are obtained by measuring the pseudo overlay between mirrored comb patterns and mirrored dagger patterns respectively. The data in FIG. 13 is shown as a function of normalized "set" dose and defocus values E and F. The dots show the overlay data measured on an FEM wafer, the upper data sets being obtained from the comb-type marks and the lower data sets being obtained from the dagger-type marks. The curves show the best fit for a parametric model of the following form:

$$O_C = a_{00} + a_{10}E + a_{01}F$$

$$O_D = b_{00} + b_{10}E + b_{02}(F-F_0)^2$$

The best fit to the data was obtained for the following set of parameters:

TABLE 1

| | | |
|---|---|---|
| $O_C$ | $a_{00}$ | −0.89 |
| | $a_{10}$ | 0.68 |
| | $a_{01}$ | −0.86 |
| $O_D$ | $b_{00}$ | −2.17 |
| | $b_{10}$ | 0.42 |
| | $b_{02}$ | −0.35 |
| | $F_0$ | −1.99 |

The inverse model was then calculated as follows:

$$E_{get} = \frac{-B \pm \sqrt{B^2 - 4AC}}{2A}$$

$$F_{get} = \frac{O_C - a_{00} - a_{10} E_{get}}{a_{01}}$$

wherein:

$$A = b_{02}\left(\frac{a_{10}}{a_{01}}\right)^2$$

$$B = b_{10} - 2b_{02}\left(\frac{a_{10}}{a_{01}}\right)\left(\frac{O_C - a_{00}}{a_{01}} - F_0\right)$$

$$C = b_{00} - O_D + b_{02}\left(\frac{O_C - a_{00}}{a_{01}} - F_0\right)^2$$

The calibration procedure is typically done for a plurality of targets distributed across the area of a printed pattern, i.e. each target allows one to determine a set of overlay measurements $O_1 \ldots O_n$ which are fitted to the set E/F and/or B values to yield a parametric model. Characteristic feature measurements $CD_1 \ldots CD_m$ are made in the vicinity of each target. Provided that the model parameters (the parameters $a_{mn}$, $b_{mn}$ and $F_0$ in the above example) between targets differ insignificantly or linearly, the characteristic feature dimensions derived from overlay measurements on the production wafer can then be used to determine feature dimensions of any number of pattern features by linear interpolation between feature dimensions determined by the method of the disclosure.

The disclosure generally involves the measured shifts over the lithography energy-focus process window being sufficiently distinct and continuous (low-order) to enable unique inversion using analytical or numerical techniques; i.e., the responses of two or more marks are transformable to physically meaningful dose and focus values. Meeting this condition can require the identification of an appropriate set of marks during process setup. Marks typically exhibit a monotonic, substantially linear response to dose, but a more complex and variable focus response. Thus, mark selection usually devolves to the evaluation and identification of distinguishable focus response.

The inventors have studied the influence of the mark shape and dimensions on the quality of the parametric model that links the pseudo-overlay values to dose and focus (E and F). As seen in FIG. 13, the pseudo-overlay response of the dagger-type mark in the X-direction is a parabolic function. The peak of the parabola indicates an optimum focus for the dagger mark. The comb-type mark exhibits a monotonic response to focus, however the data points show deviations from the linear model. Also, the response of both the dagger and comb marks as a function of dose is monotonic and substantially linear.

Figure 14:
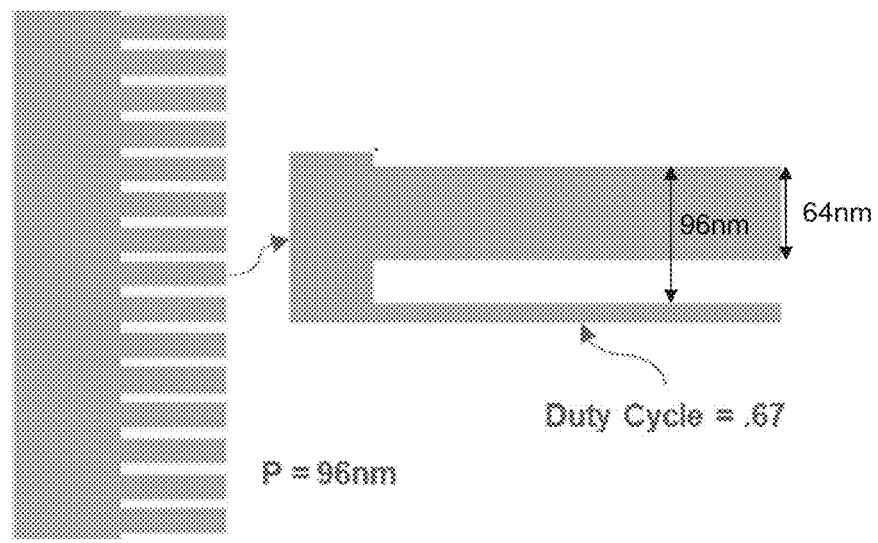
FIG. 14 illustrates the duty cycle parameter on a comb-type metrology mark, according to an example embodiment.

Further analysis has now led to the finding that, for a given lithography exposure condition, the type of response to focus of X and Y-shifts derived from comb- or dagger-type marks is sensitive to the duty cycle and pitch of the comb or dagger array. These parameters are illustrated in FIG. 14. The duty cycle is the ratio of the width of the periodic features to their pitch. In a DUV exposure case (193 nm illumination, 1.35 NA), it was found that a substantially linear monotonic response to focus is obtained when the duty cycle of the comb mark is 64 nm/96 nm or 0.67. The behavior changes to a non-monotonic response at lower duty cycles.

A monotonic response is not required for all responses, but it can make the inversion task more straightforward and ensure uniqueness. What can be required are two distinct realizable responses that enable unique inversion. This benchmark is satisfied by a monotonic dose response and a parabolic focus response paired with a monotonic dose response and a monotonic focus response (as illustrated above). It could also be satisfied by a monotonic dose response and a parabolic focus response having one vertex focus paired with a monotonic dose response and a parabolic focus response having a substantially different vertex focus.

Therefore, the set of marks needed to realize the inventive method can be appropriate for the lithography exposure conditions. For DUV exposure, an embodiment applies at least one target comprised of comb and dagger marks that cover a range of duty cycle and pitch tailored to the lithographic exposure condition. IBO targets are well suited to this method because multiple marks can be evaluated simultaneously in a single target.

Generally, according to embodiments of the disclosure, at least some of the asymmetric marks comprise mark features (for example legs of the comb), which are dimensioned and/or arranged in a manner to adjust the type of response of the mark pattern's position to a change in one or more process parameters, so that at least one response exhibits a monotonic change as a function of one of the process parameters.

Figure 15:
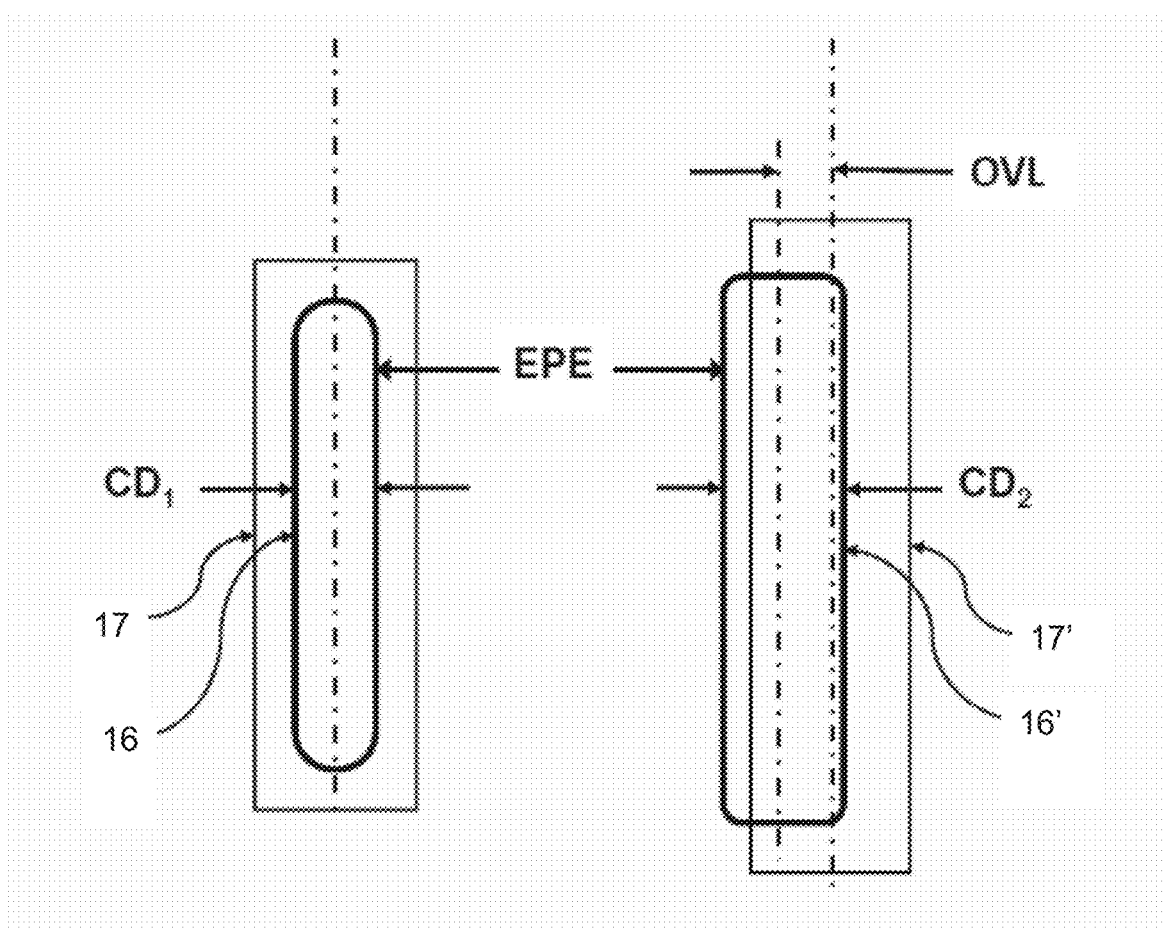
FIG. 15 illustrates a method that is applied in two layers and the overlay between the layers is taken into account to determine an edge placement error between features in the two layers, according to an example embodiment.

The disclosure is equally related to a method for estimating edge placement errors between pattern features of two different layers in a layered structure of a semiconductor chip, for example between consecutive layers applied in the back end of line process. FIG. 15 shows a detail of two superimposed patterns, each having a line feature 16 and 16' respectively. The line features are shown with respect to the as-designed features 17 and 17'. Each of these features 16/16' is produced using a separate litho and etch step, i.e. with two different masks and with a potential overlay error between the two. According to the disclosure, the dimensions $CD_1$ and $CD_2$ are determined in each layer by the above-described method, i.e. after lithography and/or after etching. In other words, in each of the two masks, a target comprising one or more asymmetric marks is provided allowing the measurement of $O_1 \ldots O_n$ after the litho and/or etching steps, the calculation of $E_{get}/F_{get}/B_{get}$, and the subsequent calculation of $CD_1$ and $CD_2$ as a function of the respective $E_{get}/F_{get}/B_{get}$ values. Then a "real" overlay measurement is done between a symmetric mark in the first layer and a symmetric mark in the second layer. A pair or a cluster of mirrored asymmetric marks can thereby be used as a symmetric mark, as mentioned in relation to FIGS. 4-9 (the measurement of the position of $O_C$ or $O_D$ in the two layers yields the overlay value). This results in the overlay error OVL indicated in the figure. The edge placement error (EPE), equally indicated in FIG. 15, between the features 16 and 16' in the final device is then calculated on the basis of this real overlay value, but taking into account the CD values obtained by the method in each layer. This allows an accurate determination of the EPE.

Figure 16A:
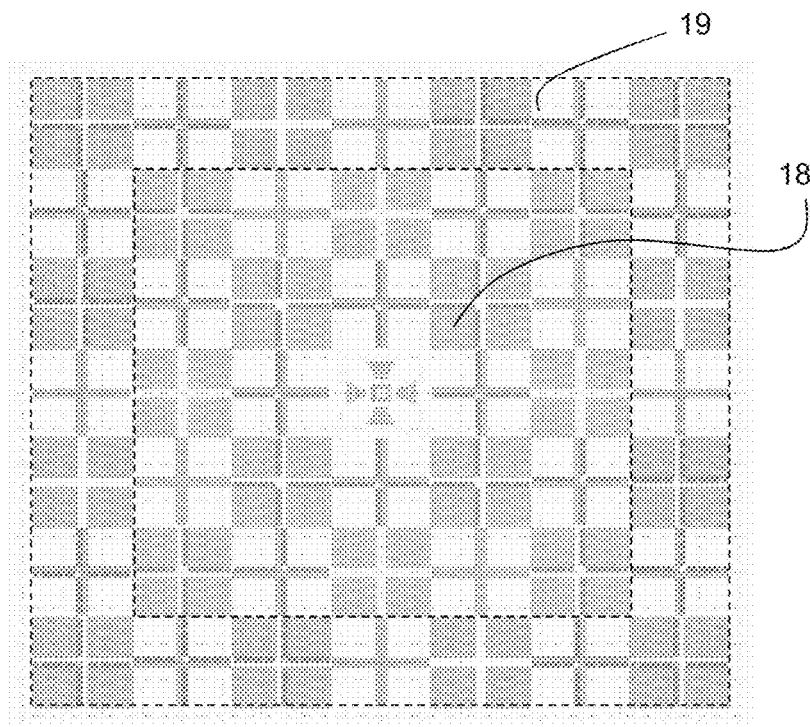
FIG. 16a shows an DBO target having marks on two different layers, according to an example embodiment.
Figure 16B:
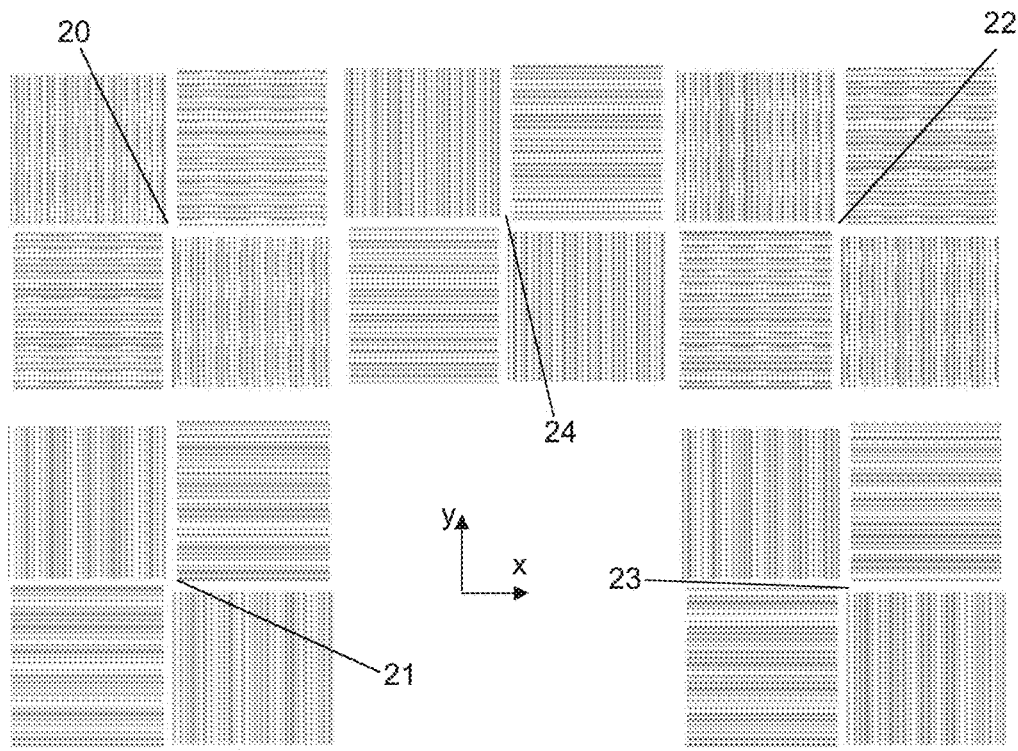
FIG. 16b shows a DBO target having marks on two different layers, according to an example embodiment.

In order to facilitate this multi-layer approach, the disclosure provides for the use of hybrid targets, as illustrated in FIGS. 16a and 16b. FIG. 16a shows a hybrid IBO target arranged in a matrix of 48 x- and y-directed crosses that fits within the field-of-view (FOV) of the IBO tool. Twenty four crosses are in the central area 18 and twenty four are in the surrounding area 19. The central area 18 may for example have the layout shown in FIG. 10. Generally the same marks are used in the two areas. The crosses in the central area are included in the litho-mask for producing a first layer, and the crosses in the surrounding area are included in the litho-mask for producing a second layer. Each mask thus has 4 sets of asymmetric marks, allowing the determination of $O_1 \ldots O_4$ in each layer and in each direction x and y. For determining the overlay OVL between the layers, the shift can be measured for one symmetric mark in the first layer with respect to the same symmetric mark in the second layer, or the shift can be measured for one pair of mirrored symmetric marks in the first layer to the same pair of mirrored asymmetric marks in the second layer.

FIG. 16b shows a DBO target distributed over two layers, i.e. distributed over two litho-masks for producing the two layers. The targets 20/21 on the left yield two different E/F/B responses in layer 1 in both x and y directions. These targets are each formed of four gratings, in the same way as shown in FIG. 12b, i.e. two pairs of gratings formed of the same marks A and B, one pair oriented in the x direction and the other pair oriented in the y direction, each pair comprising two gratings with the same marks A and B but with the distance between adjacent marks A and B shifted respectively over $+\Delta D$ and $-\Delta D$. The marks A and B used in target 20 are different than the ones used in target 21. For example, target 20 is formed of symmetric marks A and asymmetric comb marks B, while target 21 is formed of symmetric marks A and asymmetric rail marks B. So in total, the marks 20 and 21 allow one to determine four pseudo-overlay responses $O_1 \ldots O_4$ in the form of δ-values as defined with respect to FIG. 12a: 2 overlay values in the x direction (respectively the δ-values of the x-oriented gratings in marks 20 and 21) and 2 in the y direction (respectively the δ-values of the y-oriented gratings in marks 20 and 21). In the same way, the targets 22/23 on the right yield two different E/F/B responses in layer 2 in both x and y, i.e. four pseudo overlay responses $O_1 \ldots O_4$. Targets 22 and 23 are typically identical to the targets 20 and 21. The central target 24 comprises gratings with elements A and B which are symmetric but which are partially in the first layer and partially in the second layer (as in FIG. 11a). An overlay measurement between the two layers based on this target 24 thereby allows one to measure the overlay error OVL between the layers.

The edge placement error determined in the above-described way may equally be used in a control strategy for determining updated values of the litho and/or etch parameters based on a manufacturing tolerance, configured to maintain the edge placement error within the tolerance. The EPE determination according to the disclosure is typically done on a sample number of chips produced on a production wafer, allowing an update of processing parameters in the process for producing one or more subsequent chips.

While some of the focus in the above description has been on the use of the pseudo-overlay response as a position representative parameter, it should also be noted that the disclosure is not limited to the use of the pseudo-overlay values as such a parameter. Any parameter that is sensitive to the position of a printed or etched asymmetric mark can be used, as long as it allows one to determine invertible first and second parametric models in the manner described above.

The disclosure is equally related to an apparatus for lithography and etching of features on a semiconductor wafer, wherein the apparatus comprises a metrology tool configured to determine a position of a printed mark pattern and an etched mark pattern obtained from an asymmetric metrology mark included in a lithography mask applied in the apparatus. The metrology tool may comprise an IBO or DBO based overlay tool as described above, configured to measure a pseudo-overlay value or a value equivalent thereto, that is representative of the position of the asymmetric mark pattern. The apparatus furthermore comprises a computer-implemented verification unit comprising a memory provided with a computer program for executing at least the following steps, when run on the verification unit: acquiring through the metrology tool a plurality of position-representative values associated respectively to a plurality of asymmetric marks, calculating values of lithographic and/or etch parameters based on a first parametric model that links the position-representative values to the parameters, calculating characteristic dimensions of features on the wafer based on a second parametric model that links the lithographic and/or etch parameters to the characteristic dimensions, and evaluating the characteristic dimensions in comparison with a tolerance.

Typically, the verification unit is furthermore configured to update one or more of the lithographic and/or etch parameters, as appropriate for the evaluation result.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

The invention claimed is:

1. A method for determining dimensions of features in a patterned layer of a chip produced on a semiconductor production wafer, the production of the layer including a lithography act and an etching act, the lithography act including:
   applying a lithographic mask which defines a pattern of features and
   exposing a resist layer to a light source through the mask, thereby obtaining printed pattern features,
the method comprising the acts of:
   including in the mask one or more asymmetric marks which result in printed mark features in the resist layer after the lithography act, and in etched mark features after the etching act, wherein:
      the position of the printed mark features depends on the set values of one or more lithographic parameters applied in the lithography act,
      the position of the etched mark features depends on the set values of one or more etch parameters applied in the etching act,
   determining on one or more test wafers, the position or a value representative thereof, of the printed and/or etched mark features, for a plurality of different 'set' values of the lithographic and/or etch parameters,
   determining dimensions of one or more characteristic features of the patterned layer for the same plurality of set values of the lithographic and/or etch parameters,
   determining a first parametric model correlating the position of the printed and/or etched asymmetric mark features to the plurality of different set values of the lithographic and/or etch parameters, determining a second parametric model correlating the measured characteristic feature dimensions to the plurality of different values of the lithographic and/or etch parameters, inverting the first parametric model, performing the lithography and etch acts on the production wafer and determining the position of the same printed and/or etched asymmetric mark features, calculating from the inverted model a set of 'get' values of the lithographic and/or etch parameters, and determining the dimensions of one or more characteristic features on the production wafer by applying the 'get' values to the second parametric model.

2. The method according to claim 1, wherein the marks comprise at least one pair of a symmetric mark and an asymmetric mark or at least one pair of oppositely oriented asymmetric marks, and wherein in the method act 'determining on one or more test wafers, the position or a value representative thereof, of the printed and/or etched mark features, for a plurality of different 'set' values of the lithographic and/or etch parameters', a value is determined that is representative of the position of the resulting pair of printed or etched mark features, the value being a function of the distance between the pair of printed or etched features, obtained by an overlay measurement, the value being termed a 'pseudo overlay response'.

3. The method according to claim 2, wherein the overlay measurement is an image based overlay (IBO) measurement.

4. The method according to claim 3, wherein the overlay measurement is based on the determination of the centroid of an image of the asymmetric mark.

5. The method according to claim 3, wherein the marks are arranged in one or more IBO targets, located within or in the vicinity of the patterned layer, and wherein one IBO target comprises a plurality of different asymmetric marks and/or a plurality of reproductions of the same asymmetric mark in different orientations, allowing to obtain multiple pseudo-overlay responses as a function of the lithographic and/or etch parameters.

6. The method according to claim 5, wherein one or more of the IBO targets comprises one or more cross-shaped or wind-mill shaped clusters of reproductions of the same mark arranged around a central point.

7. The method according to claim 2, wherein the overlay measurement is a diffraction based overlay (DBO) measurement.

8. The method according to claim 7, wherein the marks are arranged in one or more DBO targets, located within or in the vicinity of the patterned layer, and wherein one DBO target comprises a pair of interleaved gratings, each grating formed of two marks arranged adjacently and in a repeated manner, at least one of the marks being an asymmetric mark, and wherein the distance between two adjacent marks is different in the first grating compared to the second grating, the difference between the distances being pre-defined.

9. The method according to claim 8, wherein a DBO target comprises two of the pairs of interleaved gratings, the first pair being oriented perpendicularly to the second pair.

10. The method according to claim 1, wherein additional feature dimensions in the patterned layer of the production wafer are determined by interpolation of a plurality of the characteristic feature dimensions.

11. The method according to claim 1, wherein at least some of the asymmetric marks comprise mark features, which are dimensioned and/or arranged in a manner to optimize the type of response of the mark pattern's position or position-representative value to a change in one or more lithographic and/or etch parameters, so that at least one response exhibits a monotonic change as a function of one of the lithographic and/or etch parameters.

12. The method according to claim 1, wherein the chip is produced multiple times on one or more semiconductor production wafers, and wherein:

the determination of the characteristic feature dimensions is done on a chip produced on the one or more production wafers, the characteristic feature dimensions are verified on the basis of a manufacturing tolerance, the verification results are used to calculate updated values of the lithographic and/or etch parameters, the updated values being configured to maintain the characteristic feature dimensions within the tolerance, the updated values are applied in the production of one or more subsequent chips.

13. A method for determining an edge placement error between two features of two respective patterned layers of a semiconductor chip, comprising the acts of:

determining the dimensions of the first and second feature by the method of claim 1, determining the overlay error between the first and second layer, determining the edge placement error on the basis of the overlay error, taking into account the dimensions of the first and second feature as determined in the first act.

14. The method according to claim 13, wherein the lithographic masks for producing the two layers comprise respective parts of a hybrid target, the first part comprising marks provided in the first mask, the second part comprising marks provided in the second mask, and wherein the measurement of the overlay error between the first and second layer is obtained from an overlay value measured between printed and/or etched mark features resulting from the first and second parts.

15. The method according to claim 13, wherein the chip is produced multiple times on one or more semiconductor production wafers, and wherein:

the determination of the edge placement error is done on a chip produced on the one or more production wafers, the edge placement error is verified on the basis of a manufacturing tolerance, the verification result is used to calculate updated values of the lithographic and/or etch parameters, the updated values being configured to maintain the edge placement error within the tolerance, the updated values are applied in the production of one or more subsequent chips.

16. The method according to claim 13, wherein the lithographic parameters are the dose and defocus values and wherein the etch parameter is the etch bias.

* * * * *